United States Patent
Machado et al.

(10) Patent No.: US 9,738,982 B2
(45) Date of Patent: Aug. 22, 2017

(54) DIVIDED ELECTROCHEMICAL CELL AND LOW COST HIGH PURITY HYDRIDE GAS PRODUCTION PROCESS

(71) Applicant: AIR PRODUCTS AND CHEMICALS, INC., Allentown, PA (US)

(72) Inventors: Reinaldo Mario Machado, Allentown, PA (US); Athanasios Georgios Tsirukis, Bethlehem, PA (US); Christopher L. Hartz, Slatington, PA (US); James Robert Leenhouts, Blandon, PA (US); William F. Schulze, Denver, PA (US)

(73) Assignee: VERSUM MATERIALS US, LLC, Allentown, PA (US)

( * ) Notice: Subject to any disclaimer, the term of this patent is extended or adjusted under 35 U.S.C. 154(b) by 0 days.

(21) Appl. No.: 14/822,299

(22) Filed: Aug. 10, 2015

(65) Prior Publication Data

US 2015/0345037 A1 Dec. 3, 2015

Related U.S. Application Data

(63) Continuation of application No. 13/721,608, filed on Dec. 20, 2012, now abandoned, which is a
(Continued)

(51) Int. Cl.
*C25B 1/00* (2006.01)
*C25B 9/08* (2006.01)
(Continued)

(52) U.S. Cl.
CPC .......... *C25B 15/02* (2013.01); *C23C 16/4488* (2013.01); *C25B 1/00* (2013.01);
(Continued)

(58) Field of Classification Search
CPC ....................................................... C25B 1/00
See application file for complete search history.

(56) References Cited

U.S. PATENT DOCUMENTS 3,078,218 A 2/1963 Wolfgang
3,109,791 A 11/1963 Irving
(Continued)

FOREIGN PATENT DOCUMENTS

JP 63-133464 6/1988
JP 64-031352 U 2/1989
(Continued)

*Primary Examiner* — Steven A. Friday
(74) *Attorney, Agent, or Firm* — Lina Yang

(57) ABSTRACT

This invention is an apparatus and a method for continuously generating a hydride gas of $M_1$ which is substantially free of oxygen in a divided electrochemical cell. An impermeable partition or a combination of an impermeable partition and a porous diaphragm can be used to divide the electrochemical cell. The divided electrochemical cell has an anode chamber and a cathode chamber, wherein the cathode chamber has a cathode comprising $M_1$, the anode chamber has an anode comprising $M_2$ and is capable of generating oxygen, an aqueous electrolyte solution comprising a hydroxide $M_3OH$ partially filling the divided electrochemical cell. Hydride gas generated in the cathode chamber and oxygen generated in the anode chamber are removed through independent outlets. $M_1$ can be selenium, phosphorous, silicon, metal or metal alloy, $M_2$ is metal or metal alloy suitable for anionic oxygen generation, and $M_3$ is $NH_4$ or an alkali or alkaline earth metal.

20 Claims, 10 Drawing Sheets

Related U.S. Application Data continuation of application No. 11/961,396, filed on Dec. 20, 2007, now abandoned.

(51) Int. Cl.
  *C25B 15/02* (2006.01)
  *C25B 9/16* (2006.01)
  *C23C 16/448* (2006.01)

(52) U.S. Cl.
  CPC ............... *C25B 9/08* (2013.01); *C25B 9/16* (2013.01); *Y02E 60/366* (2013.01)

(56) References Cited

U.S. PATENT DOCUMENTS

| | | |
|---|---|---|
| 3,109,793 A | 11/1963 | Irving |
| 3,404,076 A | 10/1968 | Haycock et al. |
| 3,755,128 A | 8/1973 | Herwig |
| 4,178,224 A | 12/1979 | Porter |
| 4,374,014 A | 2/1983 | Smith et al. |
| 5,158,656 A | 10/1992 | Ayers |
| 5,425,857 A | 6/1995 | Bouard et al. |
| 5,427,659 A | 6/1995 | Cadet et al. |
| 5,474,659 A | 12/1995 | Cadet et al. |
| 5,925,232 A | 7/1999 | Ayers |
| 6,080,297 A | 6/2000 | Ayers |
| 7,510,633 B2 | 3/2009 | Shimko et al. |
| 7,846,319 B2 | 12/2010 | Koyama et al. |
| 8,021,536 B2 | 9/2011 | Machado et al. |
| 8,361,303 B2 | 1/2013 | Jambunathan et al. |

FOREIGN PATENT DOCUMENTS

| | | |
|---|---|---|
| JP | 2000-501783 | 2/2000 |
| JP | 2004-059977 | 2/2004 |
| JP | 2004-238704 | 8/2004 |
| JP | 2006-518812 | 8/2006 |
| JP | 2007-527467 | 9/2007 |
| JP | 2007-284790 | 11/2007 |
| WO | 2004/079050 | 9/2004 |
| WO | 2005/005673 A2 | 1/2005 |

US 9,738,982 B2

DIVIDED ELECTROCHEMICAL CELL AND LOW COST HIGH PURITY HYDRIDE GAS PRODUCTION PROCESS

This application is a continuing application and claims the benefit of priority under 35 USC 120 of U.S. application Ser. No. 13/721,608, filed on Dec. 20, 2012; which is a continuing application and claims the benefit of priority under 35 USC 120 of U.S. application Ser. No. 11/961,396, filed on Dec. 20, 2007.

BACKGROUND OF THE INVENTION

This invention is in the field of electrochemical processes and apparatus. More specifically, the present invention is directed to the divided electrochemical cell synthesis and production of Group IV and V volatile hydrides with the simultaneous counter production of oxygen, and a reactor for carrying out the synthesis. The synthesis and the reactor are designed to more efficiently produce high purity hydrides substantially free of oxygen.

High purity gases are required for semiconductor fabrication and doping. Often these gases are dangerously toxic. Commercial compressed gas cylinders store gas at several thousand pounds per square inch pressure and contain one to ten pounds of gas. Hence, centralized production, transportation, and storage of these materials present a hazard to those working with them.

To avoid these hazards, an apparatus has been developed to provide these dangerous gases to be generated only when they are needed; such as at a chemical vapor deposition reactor in a semiconductor manufacturing plant. For example, W. M. Ayers, in U.S. Pat. Nos. 5,158,656 and 6,080,297, describes an electrochemical apparatus and method for supplying volatile hydrides at the proper pressure for introduction into a chemical vapor deposition reactor. Such processes generate metal hydride gas and hydrogen gas from the corresponding metal cathode by employing a sacrificial anode (i.e., an electrode that corrodes to an oxide) and hydroxide-based electrolytes in an undivided electrochemical cell. Such processes, however, are economically unattractive for high volume production due to high cost of the sacrificial anode metal such as molybdenum and tungsten.

Porter, in U.S. Pat. No. 4,178,224, discloses an electrochemical method for the synthesis of arsine gas that utilizes a dissolved arsenic salt in an acidic electrolyte with an oxygen evolving anode. With this method, however, the arsine concentration was limited to less than 25%. Another limitation of Porters method was the need to balance pressures and liquid levels in the divided anode and cathode sections of the electrochemical cell. This requires an inert gas supply to the electrochemical process.

Bouard, in U.S. Pat. No. 5,425,857, discloses an electrochemical process utilizing an electrolyte containing arsenic salts and acid which operates in a divided electrochemical, generating arsine and hydrogen in the cathode chamber, and oxygen in the anode chamber. The process in burdened by the need to use auxiliary gas separation tanks and multiple pumps. In addition the simultaneous metering and addition of both acid and arsenic salt is required to maintain the process.

U.S. Pat. Nos. 5,427,659, and 5,474,659, disclose the electrochemical generation of hydride gases with aqueous electrolytes under conditions that avoid oxygen formation. The hydride yield is much lower than desired.

Thus, while efforts have continued to provide effective means for producing and delivering hydride gases, there is still a need in the art to improve the quality and quantity of delivered hydride gas, especially, hydrides substantially free of oxygen product streams.

BRIEF SUMMARY OF THE INVENTION

A first embodiment of the invention includes an apparatus for generating a hydride gas of $M_1$ comprising:
  a divided electrochemical cell comprising:
    (a) tubular housing wherein at least part of the tubular housing comprising $M_2$;
    (b) an electrical insulator bottom;
    (c) an electrical insulator top lid comprising a cathode gas outlet, an anode gas outlet and a water inlet;
    (d) a divider that divides the divided electrochemical cell into a cathode chamber and an anode chamber, wherein the divider is electrically insulated from anode and cathode circuits;
    (e) the cathode chamber comprising a cathode selected from the group consisting of a solid rod of $M_1$ and a fixed bed of $M_1$ granules, and the cathode gas outlet;
    (f) the anode chamber comprising an anode that is the at least part of tubular housing comprising $M_2$, the anode gas outlet and the water inlet;
  an aqueous electrolyte solution partially filling the cathode chamber and the anode chamber comprising a hydroxide $M_3OH$;
  a first control valve connected with the cathode gas outlet;
  a second control valve connected with the anode gas outlet; and
  a third control valve connected with the water inlet;
    wherein the cathode and the anode are at least partially immersed in the aqueous electrolyte solution;
    $M_1$ is selected from the group consisting of selenium, phosphorous, silicon, a metal or a metal alloy selected from the group consisting of antimony, arsenic, germanium, lead, and cadmium; and combinations thereof;
    $M_2$ is a metal or a metal alloy suitable for anionic oxygen generation selected from the group consisting of nickel, copper, stainless steel, aluminum, and combinations thereof; and
    $M_3$ is $NH_4$ or a metal selected from the group consisting of alkali and alkaline earth metals.

Another embodiment of the invention includes a method for generating a hydride gas of $M_1$ in a divided electrochemical cell comprising (a) tubular housing wherein at least part of the tubular housing comprising $M_2$; (b) an electrical insulator bottom; (c) an electrical insulator top lid comprising a cathode gas outlet, an anode gas outlet and a water inlet; (d) a divider that divides the divided electrochemical cell into a cathode chamber and an anode chamber, wherein the divider is electrically insulated from anode and cathode circuits; (e) the cathode chamber comprising a cathode selected from the group consisting of a solid rod of $M_1$ and a fixed bed of $M_1$ granules, and the cathode gas outlet; and (f) the anode chamber comprising an anode that is the at least part of tubular housing comprising $M_2$, the anode gas outlet and the water inlet; the method comprising the steps of:
  providing an aqueous electrolyte liquid solution comprising a hydroxide $M_3OH$ in the cathode chamber and the anode chamber; wherein the cathode and the anode are at least partially immersed in the aqueous electrolyte solution;

supplying an electric power to the divided electrochemical cell;

controlling a differential pressure $\Delta P=Pc-Pa$ by using control valves connected to the cathode gas outlet and the anode gas outlet wherein Pc is a pressure in the cathode chamber and Pa is a pressure in the anode chamber;

allowing the differential pressure $\Delta P$ increase;

releasing gas generated in the cathode chamber through the cathode gas outlet as the hydride gas;

releasing gas generated in the anode chamber through the anode gas outlet; and closing the control valves;

wherein $M_1$ is selected from the group consisting of selenium, phosphorous, silicon, a metal or a metal alloy selected from the group consisting of antimony, arsenic, germanium, lead, and cadmium; and combinations thereof;

$M_2$ is a metal or a metal alloy suitable for anionic oxygen generation selected from the group consisting of nickel, copper, stainless steel, aluminum, and combinations thereof; and $M_3$ is $NH_4$ or a metal selected from the group consisting of alkali and alkaline earth metals.

Yet, another embodiment of the invention includes an apparatus for generating a hydride gas of arsenic metal comprising:

a divided electrochemical cell comprising:

(a) tubular housing wherein at least part of the tubular housing comprises metal nickel;

(b) an electrical insulator bottom;

(c) an electrical insulator top lid comprising a cathode gas outlet, an anode gas outlet and a water inlet;

(d) a divider that divides the divided electrochemical cell into a cathode chamber and an anode chamber, wherein the divider is electrically insulated from anode and cathode circuits;

(e) the cathode chamber comprising a cathode selected from the group consisting of a solid rod As and a fixed bed of As granules, and the cathode gas outlet;

(f) the anode chamber comprising an anode that is the at least part of tubular housing comprising metal nickel, the anode gas outlet and the water inlet;

an aqueous electrolyte solution comprising a hydroxide $M_3OH$ partially filling the cathode chamber and the anode chamber;

a first control valve connected with the cathode gas outlet;

a second control valve connected with the anode gas outlet;

a third control valve connected with the water inlet; and wherein the cathode and the anode are at least partially immersed in the aqueous electrolyte solution; and $M_3$ is $NH_4$ or a metal selected from the group consisting of alkali and alkaline earth metals.

Yet, another embodiment of the invention includes a method for generating a hydride gas of arsenic metal in a divided electrochemical cell comprising (a) tubular housing wherein at least part of the tubular housing comprising metal nickel; (b) an electrical insulator bottom; (c) an electrical insulator top lid comprising a cathode gas outlet, an anode gas outlet and a water inlet; (d) a divider that divides the divided electrochemical cell into a cathode chamber and a anode chamber, wherein the divider is electrically insulated from anode and cathode circuits; (e) the cathode chamber comprising a cathode selected from the group consisting of a solid rod As and a fixed bed of metal As granules, and the cathode gas outlet; and (f) the anode chamber comprising an anode that is the at least part of tubular housing comprising metal nickel, the anode gas outlet and the water inlet; the method comprising the steps of:

providing an aqueous electrolyte liquid solution comprising a hydroxide $M_3OH$ in the cathode chamber and the anode chamber; wherein the cathode and the anode are at least partially immersed in the aqueous electrolyte solution;

supplying an electric power to the divided electrochemical cell;

controlling a differential pressure $\Delta P=Pc-Pa$ by using control valves connected to the cathode gas outlet and the anode gas outlet wherein Pc is a pressure in the cathode chamber and Pa is a pressure in the anode chamber;

allowing the differential pressure $\Delta P$ increase;

releasing gas generated in the cathode chamber through the cathode gas outlet as the hydride gas;

releasing gas generated in the anode chamber through the anode gas outlet; and closing the control valves;

wherein $M_3$ is $NH_4$ or a metal selected from the group consisting of alkali and alkaline earth metals.

Yet, another embodiment of the invention includes an apparatus for generating a hydride gas of $M_1$ comprising:

a divided electrochemical cell comprising:

(a) a U-shaped tubular housing at least partially comprising $M_2$; wherein one side of the U-shaped tubular housing forms a cathode chamber;

the other side of the U-shaped tubular housing forms an anode chamber; and bottom part of the U-shaped tubular housing comprises an electrical insulator connecting the cathode chamber and the anode chamber while not allowing mixing of a cathode gas with an anode gas;

(b) the cathode chamber comprises a cathode selected from the group consisting of a solid rod of $M_1$ and a fixed bed of $M_1$ granules, and an electrical insulator top lid comprising a cathode gas outlet;

(c) the anode chamber comprises an anode that is the other side of the U-shaped tubular housing comprising $M_2$, and an electrical insulator top lid comprising a anode gas outlet and a water inlet;

an aqueous electrolyte solution comprising a hydroxide $M_3OH$ partially filling the cathode chamber and the anode chamber;

a first control valve connected with the cathode gas outlet;

a second control valve connected with the anode gas outlet;

a third control valve connected with the water inlet; and wherein the cathode and the anode are immersed in the aqueous electrolyte solution; and $M_1$ is selected from the group consisting of selenium, phosphorous, silicon, a metal or a metal alloy selected from the group consisting of antimony, arsenic, germanium, lead, and cadmium; and combinations thereof;

$M_2$ is a metal or a metal alloy suitable for anionic oxygen generation selected from the group consisting of nickel, copper, stainless steel, aluminum, and combinations thereof; and $M_3$ is $NH_4$ or a metal selected from the group consisting of alkali and alkaline earth metals.

Yet, another embodiment of the invention includes a method for generating a hydride gas of $M_1$ in a divided electrochemical cell comprising (a) a U-shaped tubular housing at least partially comprising $M_2$; wherein one side of the U-shaped tubular housing forms a cathode chamber; the other side of the U-shaped tubular housing forms an anode chamber; and bottom part of the U-shaped tubular housing comprises an electrical insulator connecting the cathode chamber and the anode chamber while not allowing mixing of a cathode gas with an anode gas; (b) the cathode chamber comprises a cathode selected from the group consisting of a solid rod of $M_1$ and a fixed bed of $M_1$ granules, and an electrical insulator top lid comprising a cathode gas outlet; (c) the anode chamber comprises an anode that is the other side of the U-shaped tubular housing comprising $M_2$, and an electrical insulator top lid comprising a anode gas outlet and a water inlet; the method comprising the steps of:

provding an aqueous electrolyte liquid solution comprising a hydroxide $M_3OH$ in the cathode chamber and the anode chamber; wherein the cathode and the anode are at least partially immersed in the aqueous electrolyte solution;

supplying an electric power to the divided electrochemical cell;

controlling a differential pressure $\Delta P = Pc - Pa$ by using control valves connected to the cathode gas outlet and the anode gas outlet wherein Pc is a pressure in the cathode chamber and Pa is a pressure in the anode chamber;

allowing the differential pressure $\Delta P$ increase;

releasing gas generated in the cathode chamber through the cathode gas outlet as the hydride gas;

releasing gas generated in the anode chamber through the anode gas outlet; and closing the control valves;

wherein $M_1$ is selected from the group consisting of selenium, phosphorous, silicon, a metal or a metal alloy selected from the group consisting of antimony, arsenic, germanium, lead, and cadmium; and combinations thereof;

$M_2$ is a metal or a metal alloy suitable for anionic oxygen generation selected from the group consisting of nickel, copper, stainless steel, aluminum, and combinations thereof; and $M_3$ is $NH_4$ or a metal selected from the group consisting of alkali and alkaline earth metals.

In the embodiments above, the hydroxide $M_3OH$ in the aqueous electrolyte solution ranges from 2% to 45% by weight.

$M_3OH$ can be further selected from the group consisting of C NaOH, KOH, LiOH, CsOH, $NH_4OH$ and combinations thereof.

In addition, the divided electrochemical cell operates under a current density ranges from about 100 to about 15,000 A/m$^2$; or a constant voltage V ranges from about 2 to about 15 volts; a temperature ranges about 15° C. to about 100° C.; Pc and Pa range from about 50,000 to about 500,000 Pa; and $\Delta P$ ranges from about 1 to about 10,000 Pa; and water is added to the anode chamber continuously or batch-wisely.

The divider is a solid impermeable partition partially extending into the aqueous electrolyte solution to prevent the mixing of the anode gas with the cathode gas.

Alternately, the divider is a combination of a solid impermeable partition and a porous permeable diaphragm wherein porous size in the porous permeable diaphragm is smaller than the gas bubbles generated in the anode chamber and the cathode chamber to prevent mixing of the gas bubbles; and the divider at least partially extends into the aqueous electrolyte solution to prevent mixing of an anode gas with a cathode gas.

The embodiments above further include a heat transfer jacket covering the tubular housing of the divided electrochemical cell comprising an inlet and an outlet for circulating cooling fluid, to control the temperature of the divided electrochemical cell.

DETAILED DESCRIPTION OF THE INVENTION

Figure 1:
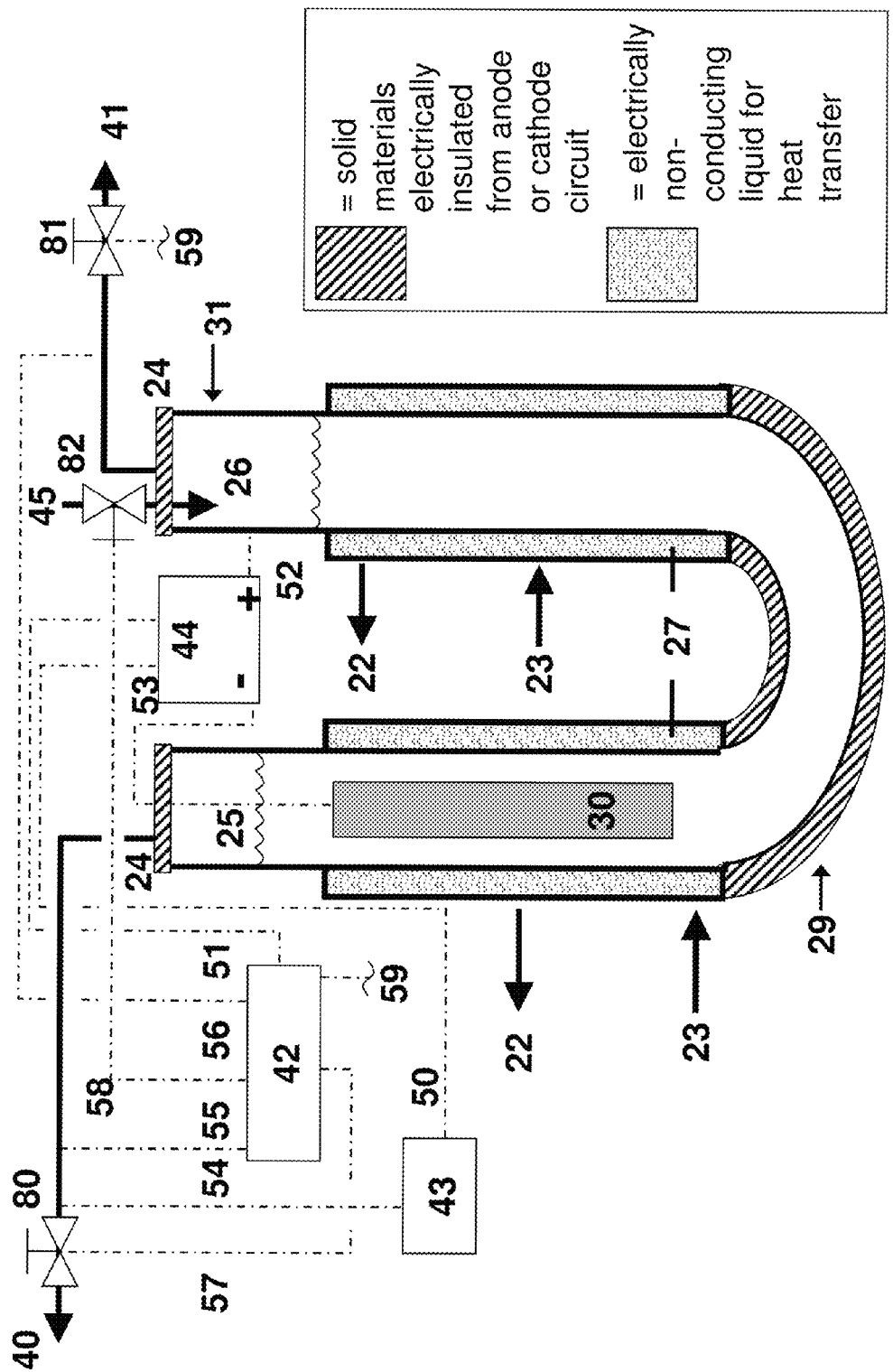
FIG. 1: Divided electrochemical cell with "U-shape" configuration. The cathode consists of a solid metal rod made of the hydride metal.

The present invention discloses apparatuses and methods to continuously manufacture a high quality and low cost hydride gas that is substantially free of oxygen, for use in the fabrication of electronic and solar cell materials.

Currently hydride gases are available in bulk high pressure cylinders or adsorbed on solid support. Hydride gases are extremely toxic and an alternative to storing them in bulk is to provide insitu production of the hydride gases by electrochemical generation. The present invention allows for reduced real time inventory of the hydride gas to a minor fraction of what would be present in any bulk storage system. In addition, hydride would be present production from the divided electrochemical cell can be instantly shut down by turning off the electrical current in the event of an unexpected safety problem in the facility using the hydride gas. Divided electrochemical cells prefitted with metal cathodes can be shipped (without hydride gas in the cell) and stored at a location for onsite operation without the concern of the hydride gas leaking.

In addition, in the current manufacturing process for arsine, zinc arsenide is reacted with sulfuric acid to general a crude arsine gas stream and a residual solid waste stream of zinc sulfate contaminated with arsenic. This waste stream must be disposed of in special hazardous waste landfills. This presents an economic/environmental penalty that is avoided if the present invention is used where minimal solid waste is generated. The electrolyte is essentially stable with the addition of make-up water alone and allows the electrolyte to be reused.

The current zinc arsenide manufacturing process creates a crude gas that contains sulfur impurities. These must be removed. The present invention avoids these impurities. However, the new process must be operated in a manner to avoid oxygen contamination of the arsine gas.

The in situ electrochemical generation of hydrides from their corresponding metal cathodes has been developed. In these processes, the anode is a sacrificial metal, such as molybdenum, cadmium, or tungsten, which is expensive and generates a salt waste. In the present invention, only water and the metal cathode are consumed and the expensive sacrificial anode is avoided. The overall process chemistry in our process is shown below, where CE (0 to 1) is the arsine current efficiency of the electrochemical process. Typical value for our process is CE=0.80 to 0.95

$$\frac{4}{3}CEAs + 2H_2O \rightarrow O_2 + 2(1-CE)H_2 + \frac{4}{3}CEAsH_3$$

The apparatus comprises a divided electrochemical cell where a solid arsenic rod serves as a cathode and a nickel tube serves as the anode. The electrolyte is any aqueous hydroxide salt, for example, 20 to 25% aqueous solution of potassium hydroxide.

The electrochemical cell is divided into an anode chamber a cathode chamber so that the oxygen and arsine gases do not mix. The gases exist via independent outlets in the gas phase of their respective chambers. Two options exist to divide the electrochemical cell and inhibit gas mixing. One option uses a solid partition and the other option uses a solid partition in combination with a porous diaphragm.

An optional cylindrical divided electrochemical cell design allows the process to efficiently operate at pressures higher than atmospheric facilitating the removal of impurities such as water and feeding to auxiliary equipment processing the hydride gas. The method of operation comprises the steps of maintaining the liquid levels to ensure that the metal hydride gas and oxygen do not mix; continuously removing the hydride gas from the cathode chamber and oxygen from the anode chamber; continually replacing water as it is consumed; controlling the liquid level to ensure that a hydraulic seal is maintained; controlling the electrical current supplied to the divided electrochemical cell to ensure that the vessel is not over pressurized; controlling the hydride stream purity so that it is substantially free of oxygen.

FIGS. 1 to 6 illustrate variations of the divided electrochemical cell designs with separate anode chamber and cathode chamber.

The following are the key notations used in FIGS. 1 through 6.

20=solid partition separating the anode chamber and cathode chamber which is electrically insulated from the anode or cathode circuit. It may be made of an insulating material such as high density polyethylene or a metal such as stainless steel provided it is insulated from the anode and cathode circuit 21=electrically nonconducting permeable diaphragm 22=cooling fluid outlet from the divided electrochemical cell jacket 23=cooling fluid inlet to the divided electrochemical cell jacket 24=solid lid with openings for the anode and cathode gases and it is electrically insulated from the anode and cathode circuit 25=cathode chamber 26=anode chamber 27=heat transfer jacket (electrically non-conducting fluid)

Figure 2:
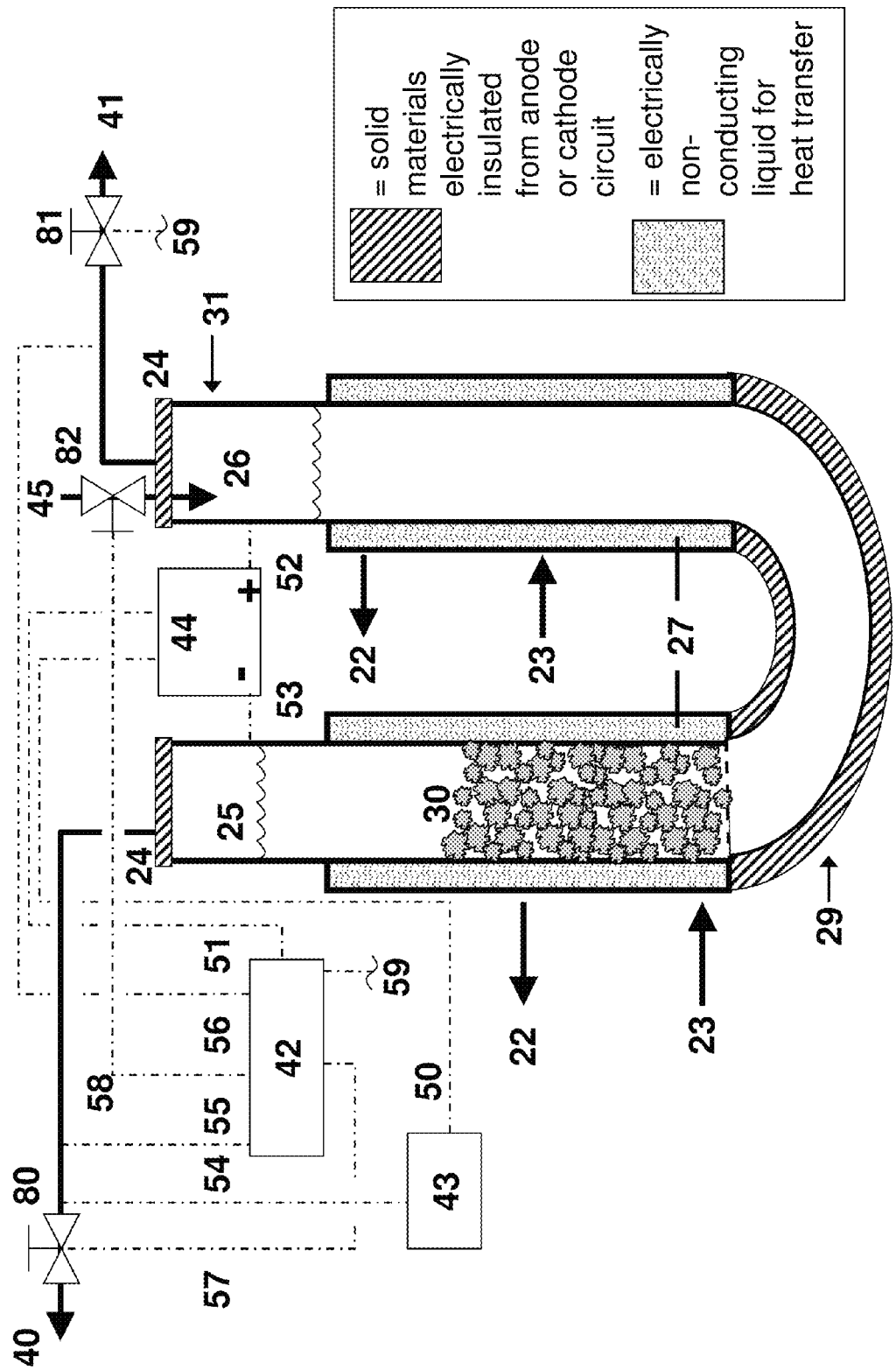
FIG. 2: Divided electrochemical cell with "U-shape" configuration. The cathode consists of a fixed bed of metal granules made of the hydride metal.

28=electrical insulator on bottom of the divided electrochemical cell to inhibit the formation of oxygen from the bottom of the divided electrochemical cell 29=a liquid conduit bottom which connects the anode chamber and cathode chamber which is electrically insulated from the anode chamber and the cathode chamber 30=arsenic electrode, solid rod or fixed bed of granular materials 31=divided electrochemical cell housing which also serves as the anode, typical construction is nickel 33=metal rod to make electrical contact with the arsenic bed 40=cathode gas outlet from the cathode chamber 41=anode gas outlet from the anode chamber 42=differential pressure transducers/controller 43=high pressure transducer/switch 44=electrical power supply 45=water feed inlet 50=high pressure alarm signal to power supply 51=differential pressure control signal to power supply 52=anode power connection 53=cathode power connection 54=high pressure input 55=differential pressure input from cathode chamber 56=differential pressure input from anode chamber 57=control signal to cathode gas control valve 58=control signal to water control valve 59=control signal to anode gas control valve 80=cathode gas control/metering valve 81=anode gas control/metering valve 82=water control/metering valve FIGS. 1 and 2 show divided electrochemical cells designed with a U-shaped tubular housing configuration where an electrically insulated conduit bottom part 29 connects the anode chamber 26 and a cathode chamber 25. The conduit is located sufficiently low so that it serves to partition the gases evolved at the anode chamber and the cathode chamber do not mix but rise via buoyancy forces into the gas "head-space" regions of their respective chambers (the top portions of chambers 26 and 25). The gases are allowed to exit out of these "head-space" regions through gas outlets 40 and 41. Make-up water can be added continuously or batch-wise via inlet 45. Continuous liquid communication between the anode chamber and cathode chamber is necessary to allow the flow of ions between the chambers, however, the openings which allow this communication should be provided so that rising bubbles of oxygen and arsine do not recombine.

In FIGS. 3 to 6, the anode chamber and cathode chamber are arranged in the form of a "tube in a tube" configuration, wherein the anode chamber is annular geometry around a central tubular cathode chamber. The particular layout is governed by materials' availability or manufacturing preference for different size of divided electrochemical cells.

Figure 3:
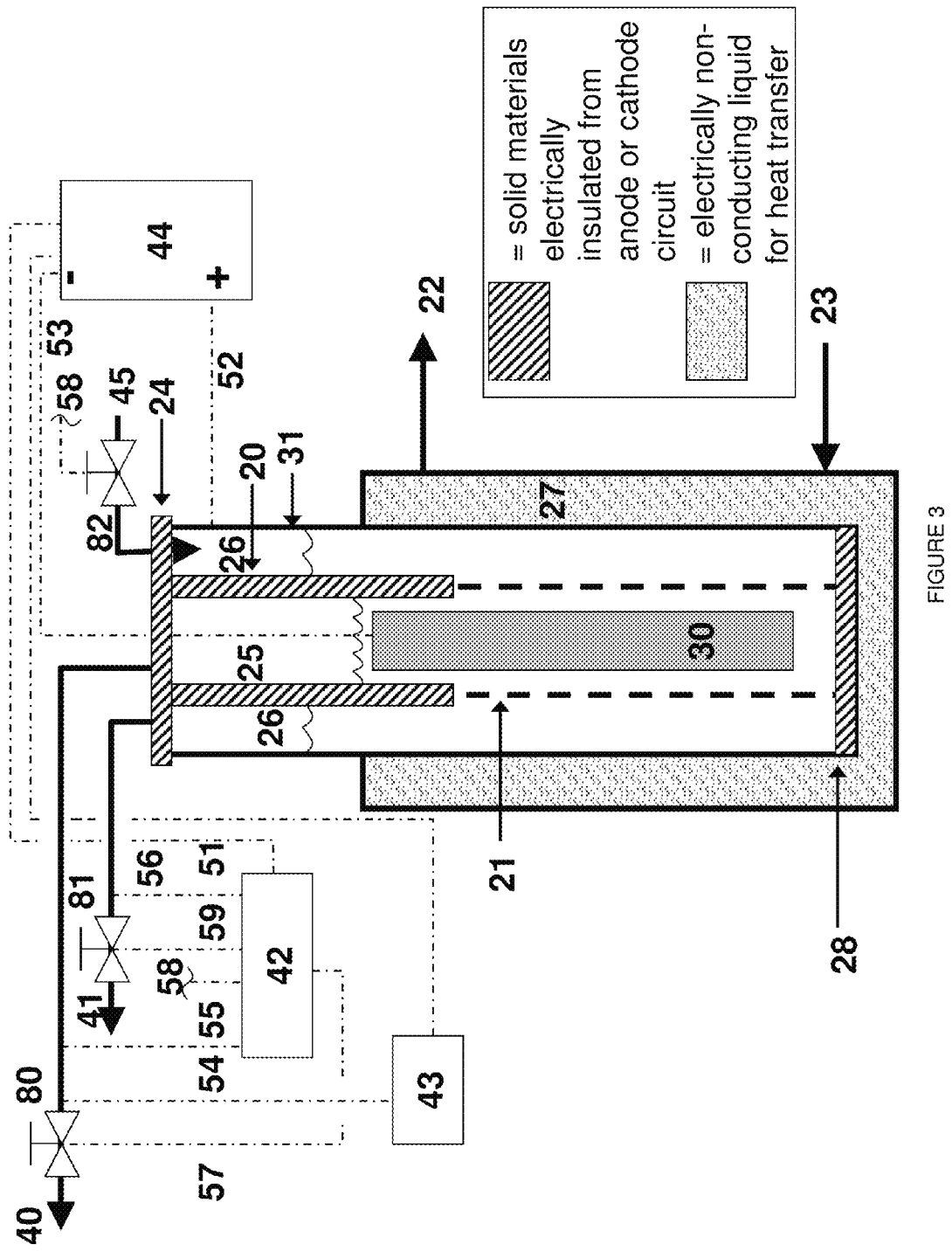
FIG. 3: Divided electrochemical cell with "tube-in-tube" configuration. A solid partition divides the electrochemical cell. The cathode consists of a solid metal rod made of the hydride metal.
Figure 4:
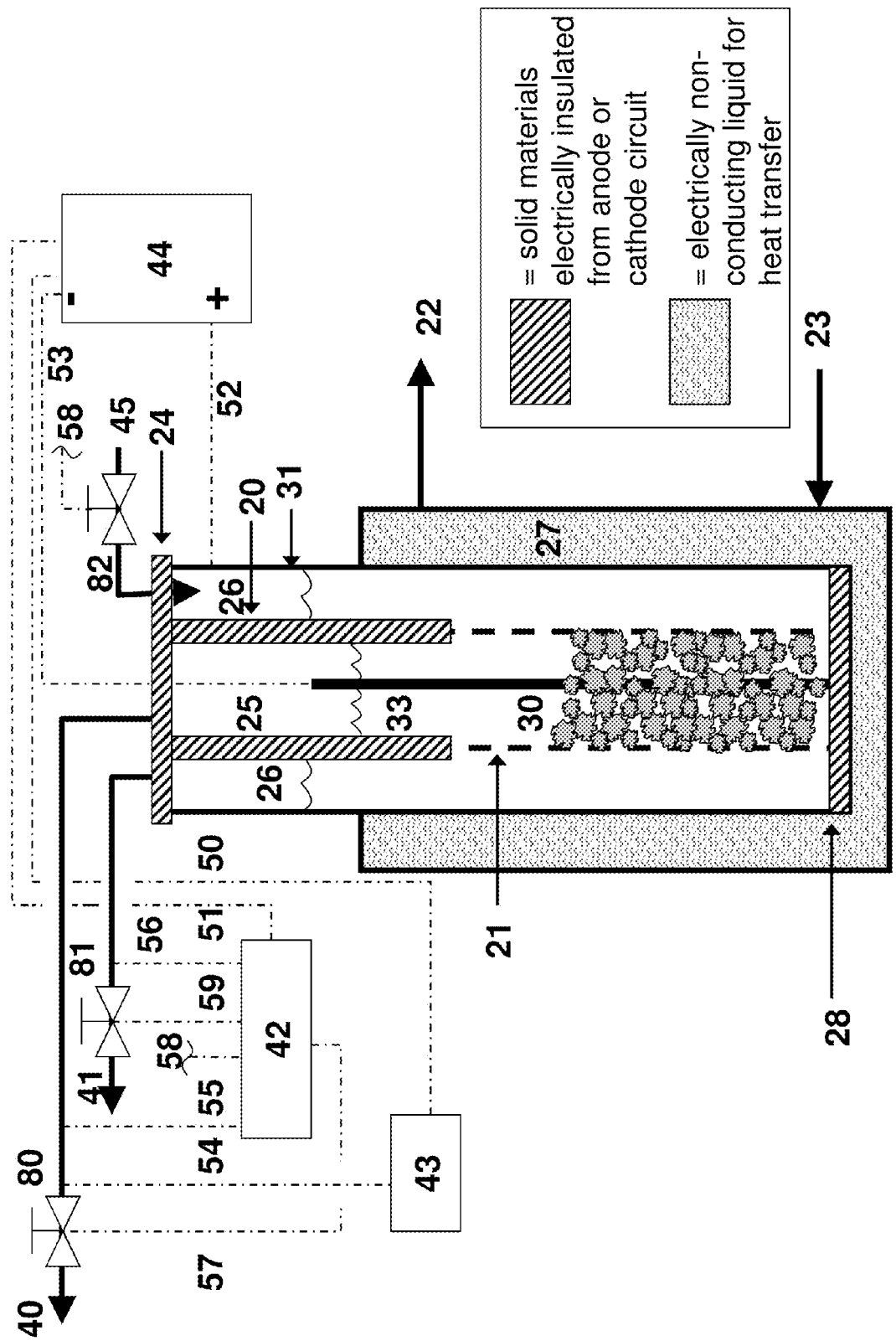
FIG. 4: Divided electrochemical cell with "tube-in-tube" configuration. A solid partition divides the electrochemical cell. The cathode consists of a fixed bed of metal granules made of the hydride metal.

FIGS. 3 and 4 show divided electrochemical cells with a "tube in a tube" structure designed with a combined solid partition 20 and porous/permeable diaphragm 21: a solid impermeable partition 20 divides the electrochemical cell into an anode chamber 26 and a cathode chamber 25. The partition 20 extends into the aqueous electrolyte where it adjoins to a porous/liquid permeable diaphragm 21. The holes in the diaphragm are sufficiently small that oxygen and arsine gas bubbles cannot pass through the diaphragm. This diaphragm may continue to the bottom of the divided electrochemical cell so that the only liquid communication between the anode and cathode chamber is through the holes in the diaphragm. The gases evolved at the anode and cathodes do not mix but rise via buoyancy forces into the gas "head-space" regions of their respective chambers (the top portions of chambers 26 and 25). The gases are allowed to exit out of these "head-space" regions through gas outlets 40 and 41. Make-up water can be added continuously or batch-wise via inlet 45. Continuous liquid communication between the anode chamber and cathode chamber (26 and 25) through the diaphragm 21 is necessary to allow the flow of ions between the chambers. In FIG. 3 the solid partition 20 is replace in part by a porous diaphragm 21 in a "tube-in-tube" design which allows liquid to flow but inhibits gas bubble passage.

Figure 5:
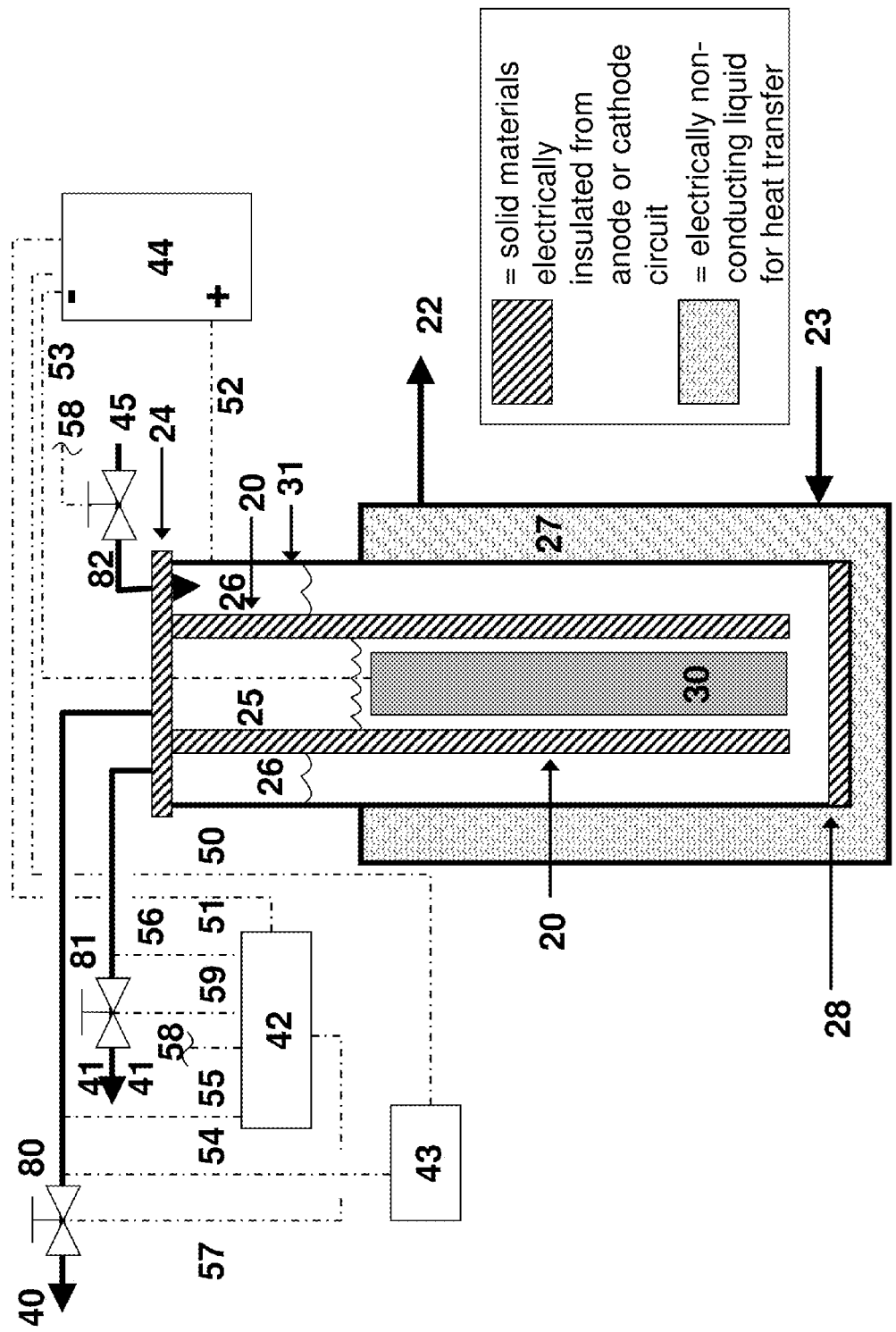
FIG. 5: Divided electrochemical cell with "tube-in-tube" configuration. A solid partition adjoining a porous diaphragm divides the electrochemical cell. The cathode consists of a solid metal rod made of the hydride metal.
Figure 6:
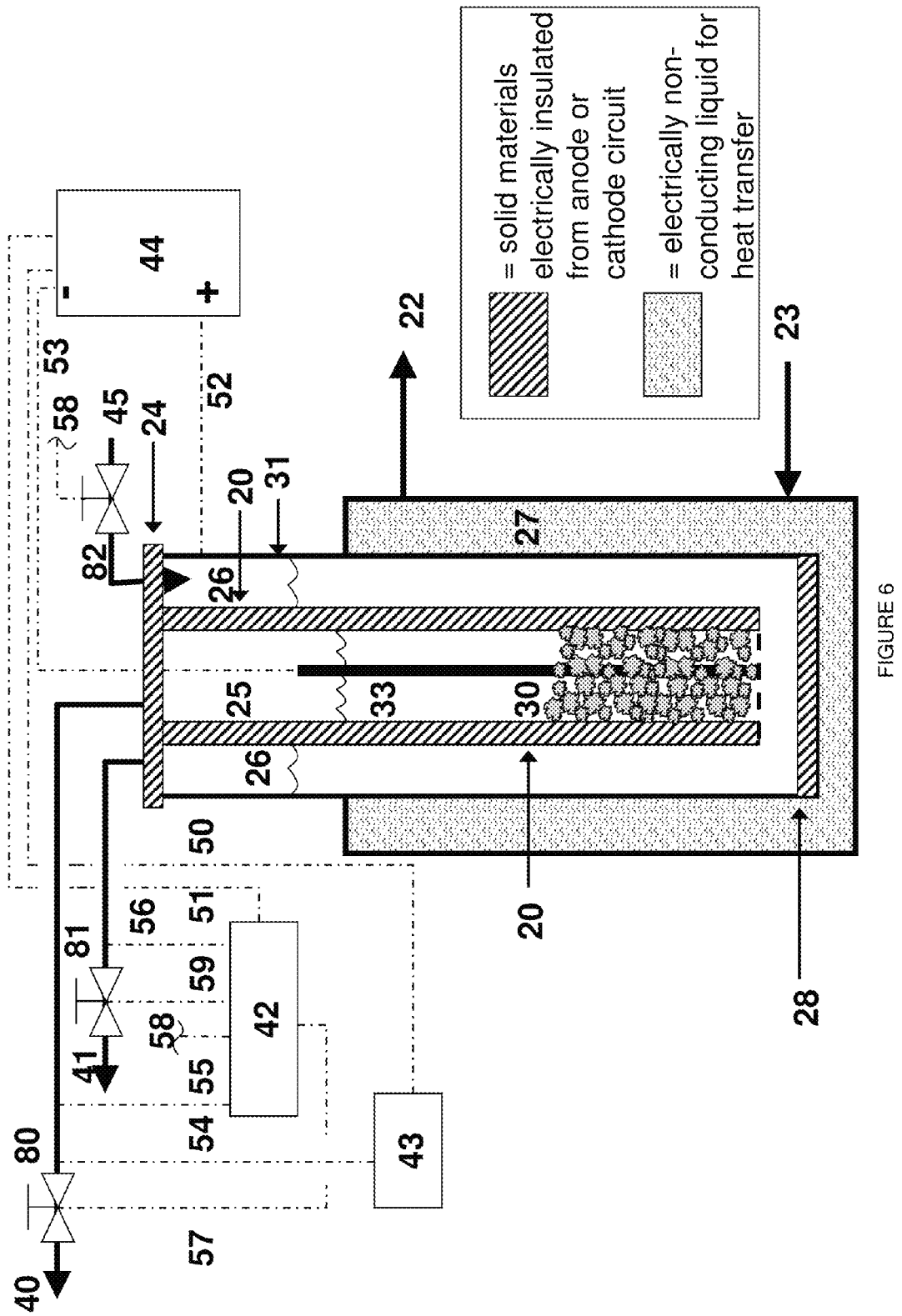
FIG. 6: Divided electrochemical cell with "tube-in-tube" configuration. A solid partition adjoining a porous diaphragm divides the electrochemical cell. The cathode consists of a fixed bed of metal granules made of the hydride metal.

FIGS. 5 and 6 show divided electrochemical cells with a "tube in a tube" structure designed with a solid partition: a solid, impermeable partition 20 divides the electrochemical cell into an anode chamber 26 and a cathode chamber 25. The partition 20 extends into the aqueous electrolyte sufficiently so that gases evolved at the anode chamber and the cathode chamber do not mix but rise via buoyancy forces into the gas "head-space" regions of their respective chambers (the top portions of chambers 26 and 25). The gases are allowed to exit out of these "head-space" regions through gas outlets 40 and 41. Make-up water can be added continuously or batch-wise via inlet 45. Continuous liquid communication between the anode chamber and cathode chamber is necessary to allow the flow of ions between the chambers, however, the openings which allow this communication should be provided so that rising bubbles of oxygen and arsine do not recombine.

A number of configurations for process control are possible.
1. The differential transducer/controller 42 can be programmed to turn-off the electrical current from the power supply 44 using control signal 51 when a unique programmed differential pressure set point measured between the differential pressure input signals from the anode chamber and cathode chamber 55, and 56, is reached.
2. An emergency shut down is also possible if the overall pressure measured from pressure input 54 to the high pressure transducer/controller 43 exceeds a preprogrammed pressure. A signal from 43 goes via control signal 50 to the power supply 44 to shut down power.
3. An alternative control scheme controls the cathode and/or anode control valves 80 and 81 should the differential pressure between 55 and 56 exceeds a control set-point.

Temperature control of the divided electrochemical cell can be achieve through a jacket 27 around the divided electrochemical cell by using a conventional source of cooling fluid (electrically non-conducting fluid) through inlet 23 which exits the jacket through outlet 22.

For divided electrochemical cells with a "tube in a tube" structure (shown in FIGS. 3 to 6), it is particularly advantageous when the anode 31 is also part of the divided electrochemical cell housing 31. Nickel is an acceptable material of construction for 31, when aqueous alkali hydroxide electrolytes are used. Composite divided electrochemical cell of plastic such as high density polyethylene with a thin nickel electrode is also acceptable.

WORKING EXAMPLES

The following examples are provided for the purpose of further illustrating the present invention but are by no means intended to limit the same.

Example 1

A divided electrochemical cell was constructed according to FIG. 1, in a "U-shaped" tube configuration. The vertical anode chamber 26 consisted of a 24.5 mm ID nickel tube and the vertical cathode chamber 25 consisted of a 24.5 mm ID 316 stainless steel tube. The two chambers were connected at the bottom via a 24.5 mm ID Teflon tube. The cathode was a 99% purity arsenic rod, 21 mm diameter and 486 mm long weighing 940 g. It was positioned in the stainless steel tube with plastic spacers to insure that the arsenic rod did not contact the stainless steel housing. The anode chamber and cathode chamber were filled with 250 ml of a 25% by weight aqueous KOH solution. The divided electrochemical cell was not jacketed and ambient external cooling was accomplished with a fan. The anode chamber was vented to the atmosphere and the oxygen generated at the anode was blended with nitrogen purge gas.

The divided electrochemical cell was operated at a constant current A of 3.0 amps or with a current density of 8,700 $A/m^2$, while the divided electrochemical cell voltage fluctuated between 10 and 12 volts. The current density is defined as the total current at the anode divided by the wetted (immersed in the aqueous KOH solution) anode geometric surface area. The differential pressure between the cathode chamber and the anode chamber was maintained between 250 and 1,000 Pa with a control valve on the cathode chamber. Above a differential pressure of 1,000 Pa the cathode gas was released from the divided electrochemical cell into the gas analyzer and collection chamber until the differential pressure reached 250 Pa at which time the control valve was closed. This effect caused the liquid level in the divided electrochemical cell to oscillate during constant current operation. The gas composition consisted of essentially 82% to 86% (mole %) arsine with the make-up consisting of hydrogen, 18% to 14%. The divided electrochemical cell temperature was maintained between 58° C. and 70° C.

The results are illustrated in FIGS. 7, 8, 9 and 10.

Figure 7:
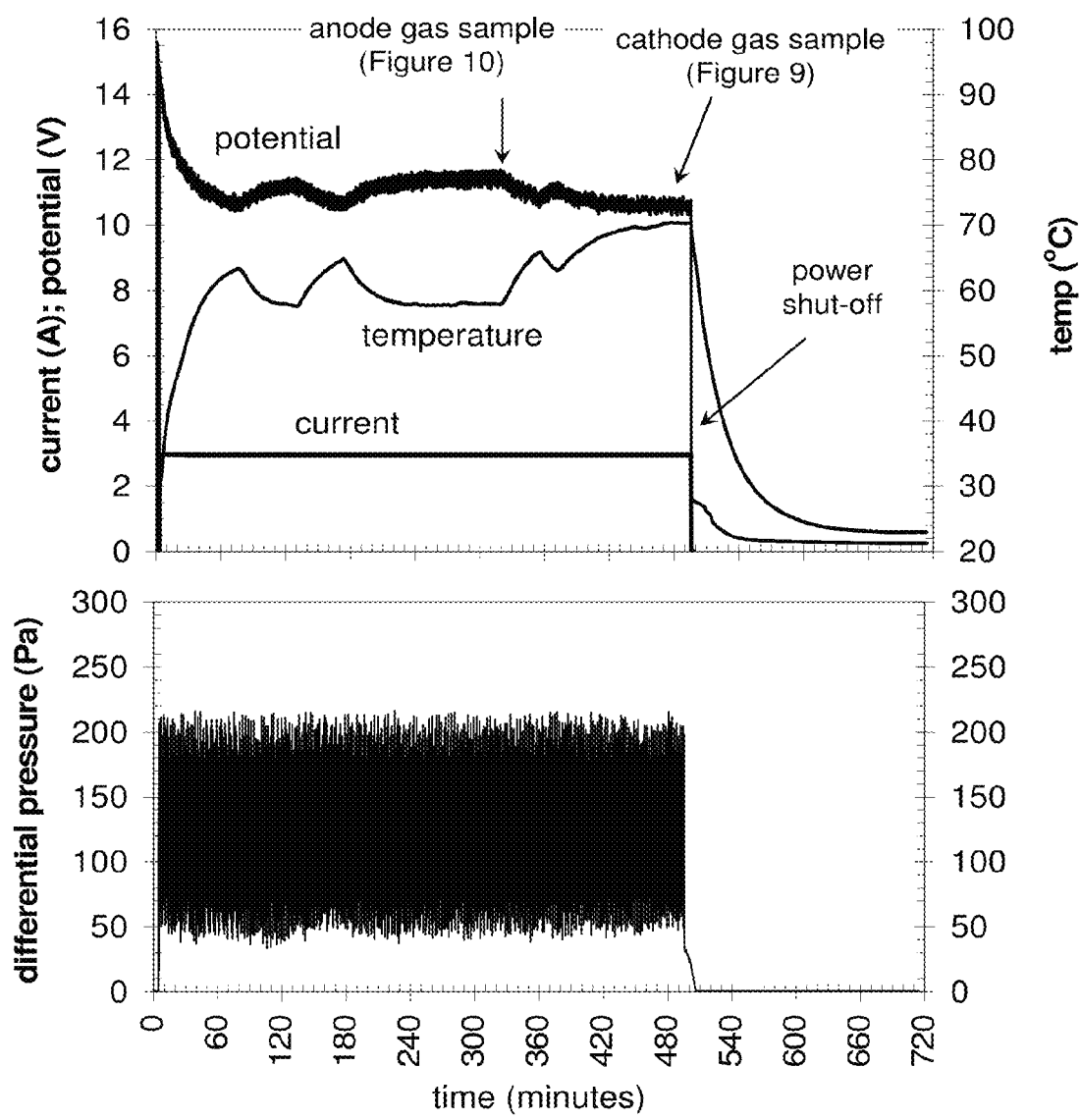
FIG. 7: Typical operating curves for the $AsH_3/O_2$ divided electrochemical cell.

FIG. 7 shows a typical operating curve for the $AsH_3/O_2$ divided electrochemical cell. Indicated are the points at which the anode and cathode gases were analyzed with a quadrapole-mass-spectrometer, QMS. The results are showing in FIGS. 9 and 10.

Figure 8:
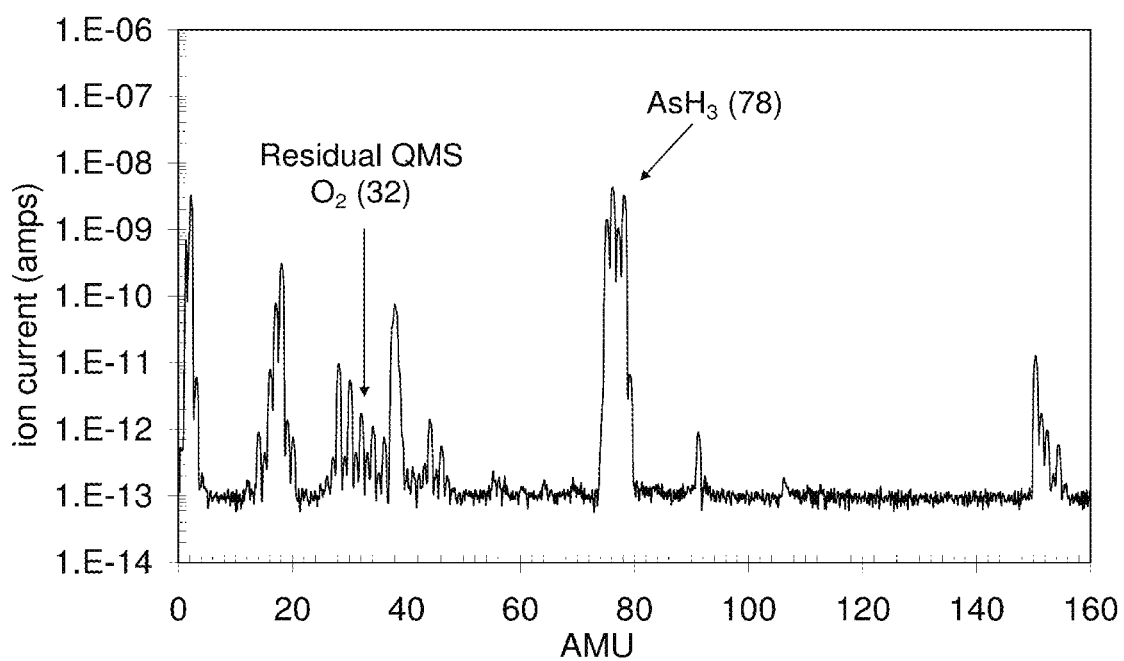
FIG. 8: Background quadrapole-mass-spectra in helium showing residual species in the analyzer.

FIG. 8 shows a background quadrapole-mass-spectra in helium showing residual species in the analyzer.

Figure 9:
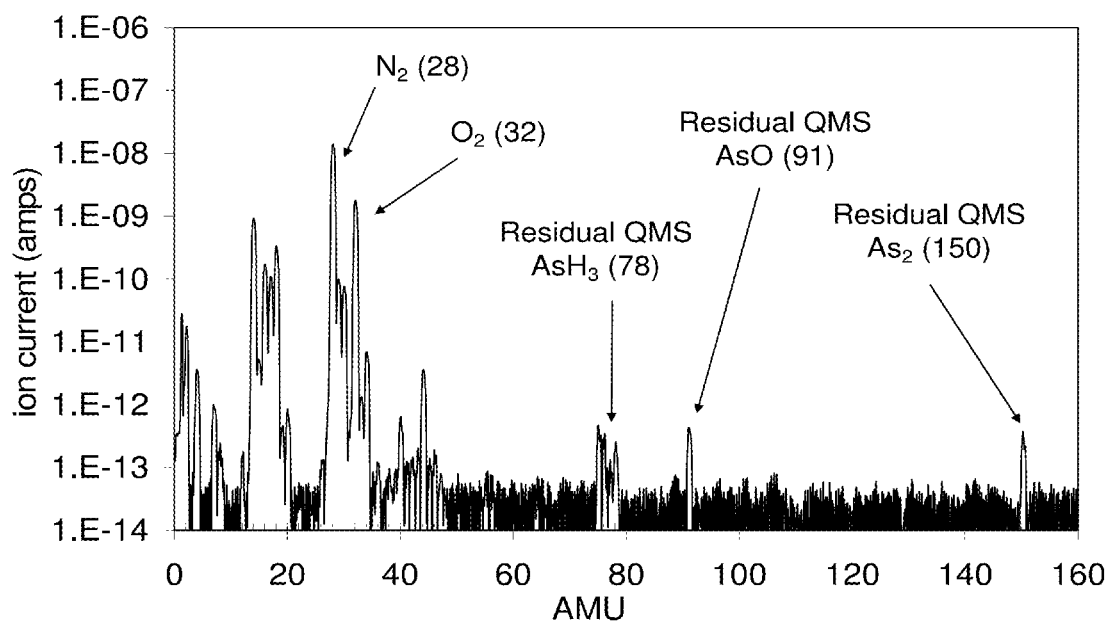
FIG. 9: Quadrapole mass spectra of the cathode gas.

FIG. 9 shows a quadrapole mass spectra of the cathode gas showing essentially pure arsine with a trace of hydrogen. Note that the residual oxygen is the same level as the background in FIG. 8. As the result, the arsenic gas generated in the cathode chamber is not mixed with oxygen gas generated in the anode chamber.

The generated arsine from a divided electrochemical cell divided into an anode chamber and a cathode chamber by solid partition, as designed in FIGS. 1 and 3, is substantially free of oxygen.

Figure 10:
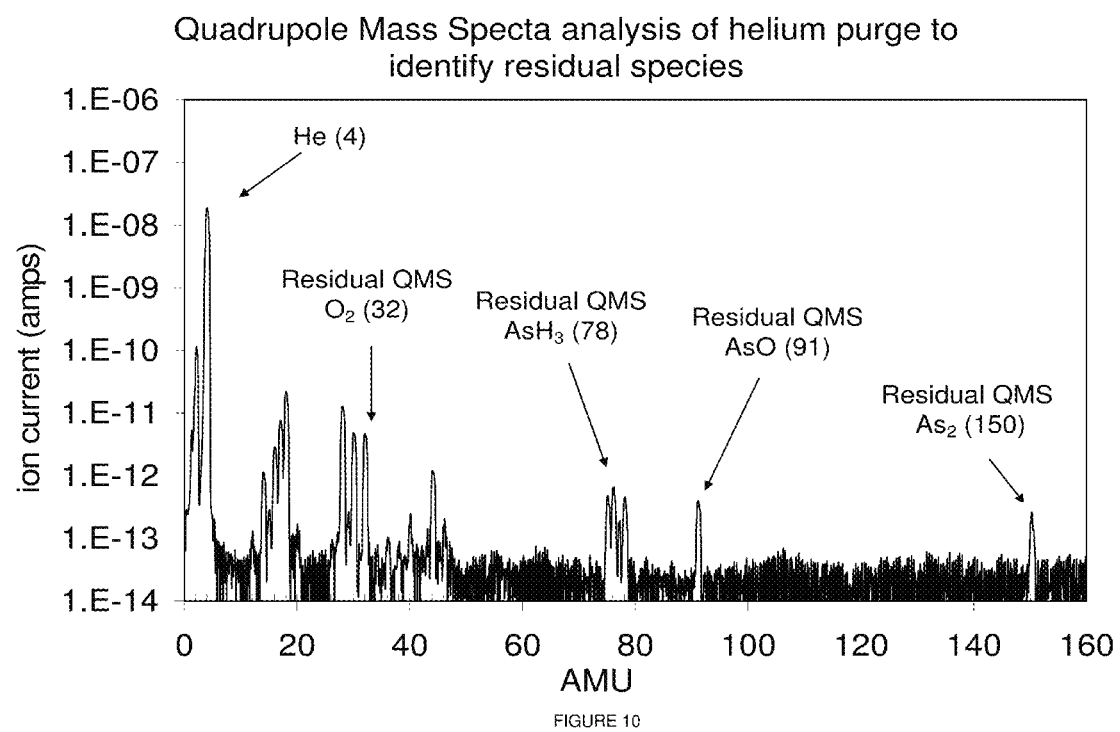
FIG. 10: Quadrapole mass spectra of the anode gas diluted with nitrogen.

FIG. 10 shows a quadrapole mass spectra of the anode gas diluted with nitrogen showing essentially pure oxygen.

Example 2

In this example the divided electrochemical cell was operated exactly as in Example 1 however the arsenic rod was replaced with a fixed bed of arsenic granules, 99% purity, with an average particle size of 3 mm. The arsenic granular bed was 1" tall and made electrical contact with the stainless steel tubular housing. The negative electrode from the power supply was attached to the outer wall of the stainless steel cathode housing and made electrical connection was made to the arsenic bed. The arsine gas was approximately 85% with the remainder consisting of hydrogen and was substantially free of oxygen <100 ppm.

Example 3

In this example the divided electrochemical cell was operated exactly as in Example 1 however a 32 gram sample of the arsine was collected, analyzed via gas chromatography and the results summarized in Table 1. The oxygen level was maintained at 14.1 ppm. Other than hydrogen and background nitrogen no critical impurities were observed especially germane and phosphine.

TABLE 1

| Species | Name | Amount |
| --- | --- | --- |
| $AsH_3$ | Arsine | >90% |
| $H_2$ | Hydrogen | 24514 ppmv |
| $CO_2$ | Carbon Dioxide | 2.32 ppmv |
| CO | Carbon Monoxide | <30 ppbv |
| $C_2H_6$ & $CH_4$ | Ethane & Methane | 20 ppbv |
| $GeH_4$ | Germane | <30 ppbv |
| $N_2$ | Nitrogen | 4544 ppmv |
| $O_2$ | Oxygen | 14.1 ppmv |
| $PH_3$ | Phosphine | 30 ppbv |
| $SiH_4$ | Silane | <30 ppbv |
| $C_2H_4$ | Ethene | <30 ppbv |

Example 4

A divided electrochemical cell was built according to FIG. 5. The outer walls-housing of the divided electrochemical cell 31 was constructed of Nickel-200 had an inner diameter of 152 mm. This formed the outer anode chamber 26. The inner diaphragm 21 had an inner diameter of 76 mm and was constructed of porous polyethylene with an average pore size of 0.100 mm. The arsenic rod 30 in the cathode chamber 25 was approximately 51 mm in diameter, 305 mm long and weighed 3,000 g and had a purity of 99%. The solid partition 20 separating the anode and cathode chambers (26 and 25) was integral to the lid of the divided electrochemical cell 24 and was made of stainless steel. The lid 24 and partition 20 were electrically insulated from both the anode and cathode electrodes using a Teflon gasket. The overall divided electrochemical cell height was approximately 610 mm tall and was filled with eight leaders of 25% potassium hydroxide.

The temperature in the divided electrochemical cell was controlled to between 20 and 25° C. using the outer cooling jacket 27. A constant current of 30 amps or a current density of 610 A/m² was applied to the divided electrochemical cell while the differential pressure between the anode chamber and cathode chamber (26 and 25) was maintained between ±50 Pa using the anode gas valve (81).

The gas composition of the anode gas was continuously monitored by mass spectroscopy and gas chromatography. Trace gas analysis was conducted on the arsine gas and the overall gas composition is shown in Table 2. The cathode gas composition was stable, with the primary gas species being arsine between 95 and 97% with the remainder being hydrogen.

TABLE 2

| Species | Name | Amount |
| --- | --- | --- |
| $AsH_3$ | Arsine | 95-97% |
| $H_2$ | Hydrogen | 5-3% |
| $CO_2$ | Carbon Dioxide | <10 ppbv |
| CO | Carbon Monoxide | <10 ppbv |
| $C_2H_6$ & $CH_4$ | Ethane & Methane | <10 ppbv |
| $GeH_4$ | Germane | <10 ppbv |
| $N_2$ | Nitrogen | 24 ppmv |
| $O_2$ | Oxygen | 105 ppbv |
| $PH_3$ | Phosphine | <10 ppbv |
| $SiH_4$ | Silane | <10 ppbv |
| $C_2H_4$ | Ethene | <10 ppbv |

The generated arsine from a divided electrochemical cell divided into an anode chamber and a cathode chamber by using a solid partition in combination with a porous diaphragm, as designed in FIG. 5, is substantially free of oxygen.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The invention claimed is:

1. An apparatus for generating a hydride gas of $M_1$ comprising:
   a divided electrochemical cell comprising:
   (a) tubular housing wherein at least part of the tubular housing comprising $M_2$;
   (b) an electrical insulator bottom;
   (c) an electrical insulator top lid comprising a cathode gas outlet, an anode gas outlet and a water inlet;
   (d) a divider that divides the divided electrochemical cell into a cathode chamber and an anode chamber, wherein the divider is electrically insulated from anode and cathode circuits;
   (e) the cathode chamber comprising a cathode selected from the group consisting of a solid rod of $M_1$ and a fixed bed of $M_1$ granules, and the cathode gas outlet;
   (f) the anode chamber comprising an anode that is part of tubular housing comprising $M_2$, the anode gas outlet and the water inlet;
   an aqueous electrolyte solution partially filling the cathode chamber and the anode chamber comprising a hydroxide $M_3OH$;
   a first control valve connected with the cathode gas outlet;
   a second control valve connected with the anode gas outlet; and a third control valve connected with the water inlet;
wherein
the cathode and the anode are at least partially immersed in the aqueous electrolyte solution;
the cathode, the anode and the divider are spaced apart;
$M_1$ is selected from the group consisting of selenium, phosphorous, silicon, antimony, arsenic, lead, cadmium; and combinations thereof;
$M_2$ is a metal or a metal alloy suitable for anionic oxygen generation selected from the group consisting of nickel, copper, stainless steel, aluminum, and combinations thereof; and
$M_3$ is $NH_4$ or a metal selected from the group consisting of alkali and alkaline earth metals.

2. The apparatus of claim 1, wherein the $M_3OH$ is selected from the group consisting of NaOH, KOH, LiOH, CsOH, $NH_4OH$ and combinations thereof; and the $M_3OH$ in the aqueous electrolyte solution ranges about 2% to about 45% by weight.

3. The apparatus of claim 1 further comprising a heat transfer jacket covering the tubular housing of the divided electrochemical cell; wherein the heat transfer jacket comprises an inlet and an outlet for circulating cooling fluid.

4. The apparatus of claim 1 wherein the divider is at least partially extends into the aqueous electrolyte solution to prevent mixing of an anode gas with a cathode gas; and is selected from the group consisting of a solid impermeable partition; and a combination of a solid impermeable partition and a porous permeable diaphragm wherein pore size in the porous permeable diaphragm is smaller than gas bubbles generated in the anode chamber and the cathode chamber to prevent mixing of the gas bubbles.

5. The apparatus of claim 1 wherein $M_1$ is arsenic; and $M_2$ is nickel.

6. A method for generating a hydride gas of $M_1$ using the apparatus of claim 1; comprising
supplying an electric power to the divided electrochemical cell;
controlling a differential pressure $\Delta P=Pc-Pa$ by using the first and the second control valves; wherein Pc is a pressure in the cathode chamber and Pa is a pressure in the anode chamber;
allowing the differential pressure $\Delta P$ increase;
releasing gas generated in the cathode chamber through the cathode gas outlet as the hydride gas;
releasing gas generated in the anode chamber through the anode gas outlet; and
closing the control valves.

7. The method of claim 6 wherein the divider is at least partially extends into the aqueous electrolyte solution to prevent mixing of an anode gas with a cathode gas; and is selected from the group consisting of a solid impermeable partition; and a combination of a solid impermeable partition and a porous permeable diaphragm wherein pore size in the porous permeable diaphragm is smaller than gas bubbles generated in the anode chamber and the cathode chamber to prevent mixing of the gas bubbles.

8. The method of claim 6 wherein the $M_3OH$ in the aqueous electrolyte solution ranges about 2% to about 45% by weight, and the $M_3OH$ is selected from the group consisting of NaOH, KOH, LiOH, CsOH, $NH_4OH$ and combinations thereof.

9. The method of claim 6 wherein the electric power is supplied through a constant current density ranging from about 100 to about 15,000 A/m$^2$; or a constant voltage V ranging from about 2 to about 15 volts; Pc and Pa range from about 50,000 to about 500,000 Pa; $\Delta P$ ranges from about 1 to about 10,000 Pa; the divided electrochemical cell is operated at a temperature ranging from about 15° C. to about 100° C.; and water is added to the anode chamber continuously or batch-wisely.

10. The method of claim 6 wherein $M_1$ is arsenic; and $M_2$ is nickel.

11. An apparatus for generating a hydride gas of $M_1$ comprising:
a divided electrochemical cell comprising:
(a) a U-shaped tubular housing at least partially comprising $M_2$; wherein
one side of the U-shaped tubular housing forms a cathode chamber;
the other side of the U-shaped tubular housing forms an anode chamber; and
bottom part of the U-shaped tubular housing comprises an electrical insulator connecting the cathode chamber and the anode chamber while not allowing mixing of a cathode gas with an anode gas;
(b) the cathode chamber comprises a cathode selected from the group consisting of a solid rod of $M_1$ and a fixed bed of $M_1$ granules, and an electrical insulator top lid comprising a cathode gas outlet;
(c) the anode chamber comprises an anode that is the other side of the U-shaped tubular housing comprising $M_2$, and an electrical insulator top lid comprising a anode gas outlet and a water inlet;
an aqueous electrolyte solution comprising a hydroxide $M_3OH$ partially filling the cathode chamber and the anode chamber;
a first control valve connected with the cathode gas outlet;
a second control valve connected with the anode gas outlet;
a third control valve connected with the water inlet; and
wherein
the cathode and the anode are immersed in the aqueous electrolyte solution;
$M_1$ is selected from the group consisting of selenium, phosphorous, silicon, antimony, arsenic, germanium, lead, cadmium; and combinations thereof; and
$M_2$ is a metal or a metal alloy suitable for anionic oxygen generation selected from the group consisting of nickel, copper, stainless steel, aluminum, and combinations thereof; and
$M_3$ is $NH_4$ or a metal selected from the group consisting of alkali and alkaline earth metals.

12. The apparatus of claim 11 further comprising a heat transfer jacket covering the tubular housing of the divided electrochemical cell; wherein the heat transfer jacket comprises an inlet and an outlet for circulating cooling fluid.

13. The apparatus of claim 11, wherein the $M_3OH$ in the aqueous electrolyte solution ranges about 2% to about 45% by weight.

14. The apparatus of claim 11 wherein the $M_3OH$ is selected from the group consisting of NaOH, KOH, LiOH, CsOH, $NH_4OH$ and combinations thereof.

15. The apparatus of claim 11 wherein $M_1$ is arsenic; and $M_2$ is nickel.

16. A method for generating a hydride gas of $M_1$ in a divided electrochemical cell comprising (a) a U-shaped tubular housing at least partially comprising $M_2$; wherein one side of the U-shaped tubular housing forms a cathode chamber; the other side of the U-shaped tubular housing forms an anode chamber; and bottom part of the U-shaped tubular housing comprises an electrical insulator connecting the cathode chamber and the anode chamber while not allowing mixing of a cathode gas with an anode gas; (b) the cathode chamber comprises a cathode selected from the group consisting of a solid rod of $M_1$ and a fixed bed of $M_1$ granules, and an electrical insulator top lid comprising a cathode gas outlet; (c) the anode chamber comprises an anode that is the other side of the U-shaped tubular housing comprising $M_2$, and an electrical insulator top lid comprising a anode gas outlet and a water inlet; the method comprising the steps of:

provided an aqueous electrolyte liquid solution comprising a hydroxide $M_3OH$ in the cathode chamber and the anode chamber; wherein the cathode and the anode are at least partially immersed in the aqueous electrolyte solution;

supplying an electric power to the divided electrochemical cell;

controlling a differential pressure $\Delta P=Pc-Pa$ by using control valves connected to the cathode gas outlet and the anode gas outlet wherein Pc is a pressure in the cathode chamber and Pa is a pressure in the anode chamber;

allowing the differential pressure $\Delta P$ increase;

releasing gas generated in the cathode chamber through the cathode gas outlet as the hydride gas;

releasing gas generated in the anode chamber through the anode gas outlet; and closing the control valves;

wherein
  $M_1$ is selected from the group consisting of selenium, phosphorous, silicon, antimony, arsenic, germanium, lead, cadmium; and combinations thereof; and
  $M_2$ is a metal or a metal alloy suitable for anionic oxygen generation selected from the group consisting of nickel, copper, stainless steel, aluminum, and combinations thereof; and
  $M_3$ is $NH_4$ or a metal selected from the group consisting of alkali and alkaline earth metals.

17. The method of claim 16 wherein hydroxide $M_3OH$ is selected from the group consisting of NaOH, KOH, LiOH, CsOH, $NH_4OH$ and combinations thereof.

18. The method of claim 16 wherein hydroxide $M_3OH$ in the aqueous electrolyte solution ranges about 2% to about 45% by weight.

19. The method of claim 16 wherein $M_1$ is arsenic; and $M_2$ is nickel.

20. The method of claim 16 wherein the electric power is supplied through a constant current density ranging from about 100 to about 15,000 $A/m^2$; or a constant voltage V ranging from about 2 to about 15 volts; Pc and Pa range from about 50,000 to about 500,000 Pa, $\Delta P$ ranges from about 1 to about 10,000 Pa; the divided electrochemical cell is operated at a temperature ranging from about 15° C. to about 100° C.; and water is added to the anode chamber continuously or batch-wisely.

* * * * *